(12) United States Patent
Chen

(10) Patent No.: US 7,567,026 B2
(45) Date of Patent: Jul. 28, 2009

(54) ION SOURCE AND POLISHING SYSTEM USING THE SAME

(75) Inventor: Ga-Lane Chen, Santa Clara, CA (US)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 400 days.

(21) Appl. No.: 11/309,597

(22) Filed: Aug. 29, 2006

(65) Prior Publication Data
US 2007/0132358 A1    Jun. 14, 2007

(30) Foreign Application Priority Data
Dec. 14, 2005    (CN) .................. 200510120697.7

(51) Int. Cl.
*H05H 5/03*    (2006.01)
(52) U.S. Cl. ................... 313/361.1; 313/231.31
(58) Field of Classification Search .............. 313/361.1, 313/360.1, 231.31, 230; 315/5.33, 111.81
See application file for complete search history.

(56) References Cited

U.S. PATENT DOCUMENTS

2004/0022161 A1    2/2004    Wood

*Primary Examiner*—Joseph L Williams

(57) ABSTRACT

An ion source and a polishing system using the ion source are disclosed. The ion source includes a discharge chamber, an electron emitter, a cathode, a screen grid, an accelerator grid, and a screen electrode. The discharge chamber is configured for accommodating discharge gas. The electron emitter is disposed in the discharge chamber. The cathode, the screen grid, the accelerator grid, and the accelerator grid are separately aligned in the discharge chamber in an ascending order with respect to the respective distance thereof from the electron emitter. The electron emitter, the cathode, the screen grid, the accelerator grid, and the accelerator grid are powered in order of descending voltages. The screen electrode defines an adjustable orifice to permit adjustment of an ion-beam ejecting area associated with the orifice. The polishing system further employs a movable stage and control and monitor components, in addition to the ion source.

18 Claims, 5 Drawing Sheets

ION SOURCE AND POLISHING SYSTEM USING THE SAME

FIELD OF THE INVENTION

The present invention relates to ion sources and, more particularly, to an ion source and a polishing system using the ion source.

DESCRIPTION OF RELATED ART

Ion sources are typically devices that ionize gas molecules and then focus, accelerate, and emit them as narrow ion beams. The ion beams can be used for various technical and technological purposes such as cleaning, activation, polishing, thin-film coating, aligning, or etching.

Many ion sources need to emit focused ion beams for some technological purposes, for example, for selectively etching and/or polishing of a small area. With advances in technology, there is increasingly a demand for precision polishing of surfaces for a variety of purposes. For example, highly polished precision surfaces are needed in molds, optical elements (e.g., optical lenses), and in the fabrication of semiconductor elements (e.g., silicon wafers).

A typical focused ion source can be used to alter selected regions on a surface of a workpiece by polishing thereof. This ion source generally includes a discharge chamber configured for accommodating a discharge gas and an ion-optical system disposed in the discharge chamber. The ion-optical system is configured for generating ion beams derived from the discharge gas and accelerating the ion beams to an appropriate level of energy. The areas of polishing can be controlled to within a surface roughness in the nanometer range. However, in a traditional electrical discharge machining (EDM), the areas of machining become relatively rough, within surface roughness in the micrometer range. That is, this focused ion source has a relatively higher degree of roughness precision than the EDM.

However, many, if not most, workpieces have some areas that are difficult to reach/treat and/or small areas, such as, for example, a narrow area, slot, slope surface, sharp angle surface, concave portion, and/or convex portion. During polishing, the aforementioned ion source usually has a problem with the difficult and/or small areas, making polishing of such areas difficult to accurately control or at least making adjustment between different areas challenging. In other words, this ion source has generally not proven suitable for treating surfaces with difficult and/or small areas.

What is needed, therefore, is an ion source that can adjustably and controllably eject ion beams.

What is also needed, therefore, is a polishing system using the above-described ion source.

SUMMARY OF INVENTION

In accordance with a preferred embodiment, an ion source includes a discharge chamber, an electron emitter, a cathode, a screen grid, an accelerator grid, and a screen electrode. The discharge chamber is configured for accommodating a discharge gas. The electron emitter is disposed in the discharge chamber. The cathode, the screen grid, the accelerator grid, and the accelerator grid are separately aligned in the discharge chamber in an ascending order with respect to a distance from the electron emitter. The electron emitter, the cathode, the screen grid, and the accelerator grid are powered in a descending order of voltages. The screen electrode defines an adjustable orifice to adjust an ejecting area through which the ion beams can travel, thereby permitting control of the resulting beam diameter.

A polishing system includes a platform, a control device connected with the platform, a monitor device operatively linked with the control device, and an ion source. The monitor device is configured (i.e., structured and arranged) for measuring and monitoring surface characteristics of a workpiece to be polished and for transmitting information about the surface characteristics to the control device. The control device regulates the movement and rotation of the platform according to the information received from the monitor device. The ion source is mounted on the platform and is configured for ejecting ion beams. The ion source includes a discharge chamber, an electron emitter, a cathode, a screen grid, an accelerator grid, and a screen electrode. The discharge chamber is configured for accommodating a discharge gas. The electron emitter is disposed in the discharge chamber. The cathode, the screen grid, the accelerator grid, and the accelerator grid are separately aligned in the discharge chamber in an ascending order with respect to a distance thereof from the electron emitter. The electron emitter, the cathode, the screen grid, and the accelerator grid are powered in order of descending voltages. The screen electrode defines an adjustable orifice to selectably vary an ejecting area through which the ion beams can be transmitted.

Other advantages and novel features will be drawn from the following detailed description of preferred embodiments when conjunction with the attached drawings.

BRIEF DESCRIPTION OF THE DRAWINGS

Many aspects of the present ion source and polishing system can be better understood with reference to the following drawings. The components in the drawings are not necessarily drawn to scale, the emphasis instead being placed upon clearly illustrating the principles of the present ion source and the related polishing system. Moreover, in the drawings, like reference numerals designate corresponding parts throughout the several views.

DETAILED DESCRIPTION

Embodiments of the present ion source and polishing system will now be described in detail below and with reference to the drawings.

Figure 1:
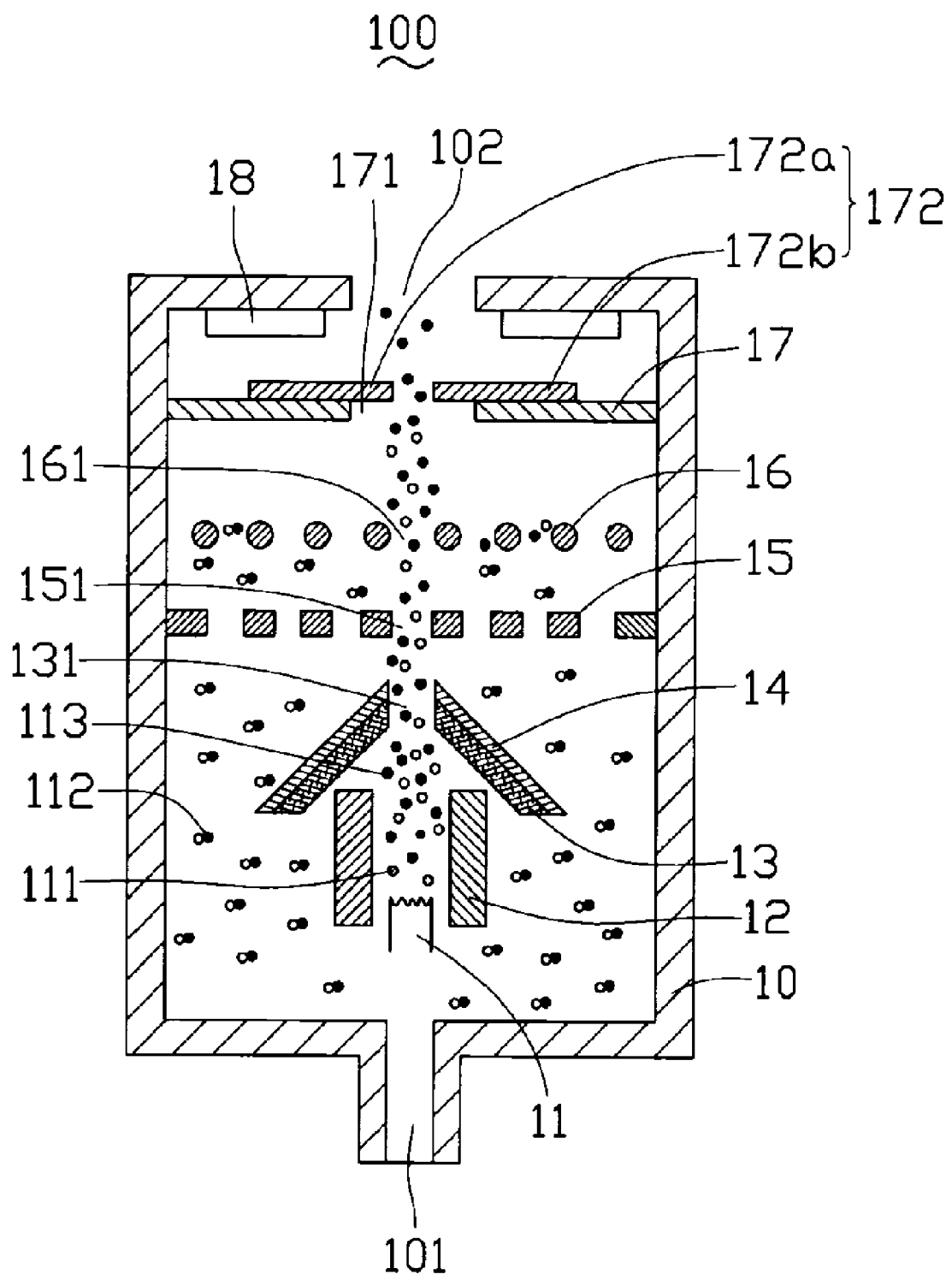
FIG. 1 is a schematic, cross-sectional view of an ion source, according to a preferred embodiment.

FIG. 1 illustrates an ion source 100, in accordance with a preferred embodiment. The source 100 includes a discharge chamber 10, an electron emitter 11, a magnetic coil 12, a cathode 13, a screen grid 15, an accelerator grid 16, a screen electrode 17, and a neutralizer 18, advantageously in that general, uninterrupted order. The discharge chamber 10 includes an inlet 101 and an outlet 102 in two opposite walls thereof. The inlet 101 is configured for supplying discharge gas (e.g., Argon) 112 into the discharge chamber 10. The outlet 102, meanwhile, is configured for allowing ion beams to eject/exit therefrom. The electron emitter 11, the magnetic coil 12, the cathode 13, the screen grid 15, the accelerator grid 16, the screen electrode 17, and the neutralizer 18 are separately aligned in the discharge chamber 10, in an ascending order with respect to their respective distance from the inlet 101.

The electron emitter 11 is surrounded by the magnetic coil 12 and disposed along an axis thereof. The electron emitter 11 may be a cathode filament made of, for example, tungsten or tantalum. The electron emitter 11 is configured (i.e., structured and arranged) for emitting electrons 111 while electric current is applied thereto.

The cathode 13 can, for example, be shaped as a conic dome. The cathode 13 is advantageously coaxial and adjacent to the magnetic coil. The cathode 13 has a top portion at a distance from the electron emitter. The top portion defines an opening. The cathode 13 has a lower voltage than the electron emitter 11. The cathode 13 can be connected to a negative terminal of a discharge power supply. For example, to provide an ion beam of singly charged argon (Ar) ions with a desired energy of about 1000 eV, the negative terminal of the beam supply is connected to a discharge anode and set to 1000 V. Due to such negative voltage, the electrons 111 are thus extracted from the electron emitter 11. The electrons 111 sequentially move helically towards and through the cathode 13, due to a magnetic field generated by the magnetic coil 12. During such movement, most of the electrons 111 collide with the discharge gas 112. These collisions ionize the discharge gas 112, thereby generating cations 113. Likewise, some cations 113 also collide the discharge gas 112 to further ionize the discharge gas 112, thereby generating cations 113 yet again.

In addition, some free electrons 112, without having collided with the discharge gas, also pass through the opening 131 of the cathode 13. After passing through the opening 131, the cations 113 and the free electrons 112 again collide with the discharge gas 112 to obtain more cations 113. Advantageously, a shield layer 14 is coated on the cathode 13, the shield layer 14 being configured for protecting the cathode 13 from being bombarded by the more cations 113. The shield layer 14 can be made of a material such as alumina, magnesium oxide, or silicon dioxide.

The screen grid 15 is spaced from the cathode 13 and defines a plurality of clearances 151 between adjacent grids. The screen grid 15 can be a conductive electrode, which is connected to a positive high voltage ion beam power supply. Thus, the screen grid 15 is the electrode controlling the potential of the cations 113, which is also effectively also the "beam voltage." The beam voltage can be in the range from 100 V to 900 V, which is lower than potential of the cathode 13 so that the cations 113 can be attracted thereto and thus move towards the screen grid 15. Some cations 113 bombard/impact the screen grid 15, while other cations 113 pass through the clearances 151 and sequentially move towards the accelerator grid 16.

The accelerator grid 16 is spaced from the screen grid 15 and defines a plurality of gaps 161 between adjacent grids. The gaps 161 of the accelerator grid 16 are substantially aligned or coaxial with the clearances 151 of the screen grid 15. The accelerator grid 16 has a lower voltage than the screen grid 15 so that the cations 113 can be accelerated to move towards the accelerator grid 16. For example, the accerelator voltage could be about −400 V. Similarly, a minority of the cations 113 may impact the accelerator grid 16, while a majority of the cations 113 avoid such a collision and pass through the gaps 161 and sequentially move towards the screen electrode 17. After passing through the screen grid 15, some cations 113 are lack of enough energy to continue later operation. In this circumstance, the accelerator grid 16 can provide these cations 113 further energy (hence the name acceleration grid) so as to these cations 113 have enough energy/momentum to continue later operation (i.e., to proceed to an ultimate use destination, e.g., a polishing site). Other still sufficiently energetic cations 113, accelerated by the accelerator grid 16, will, in turn, have a relatively better polishing capacity. As a result, the accelerator grid 16 can improve polishing efficiency of the ion source 100.

The screen electrode 17 is spaced from the accelerator grid 16. The screen electrode 17 can be at electrical ground potential. The screen electrode 17 defines an orifice 171 structured and arranged for allowing the cations 113 to pass through the screen electrode 17 and for thereby facilitating the ejection of the cations 113 out of the discharge chamber 10.

An adjusting member 172 is slideably mounted on the screen electrode 17. The sildeable member 172 includes two lids 172a and 172b. The two lids 172 and 172b can slide relative to each other on the screen electrode 17, for example, along a corresponding slideway (not shown) defined in the screen electrode 17. The two lids 172a and 172b cooperatively cover part or all area of the orifice 171 and can be selectably, slidably moved in order to facilitate an adjustment of a space size and/and shape of the orifice 171. Accordingly, an ejecting area of the cations 113 from the orifice 171 can be adjusted by sliding one or both of the lids 172a and 172b of the screen electrode 17.

The neutralizer 18 is positioned in the vicinity of the outlet 102, through which the cations 11 can exit, and is adjacent to the orifice 171. The neutralizer 18 is used to provide electrons for current and space charge neutralization of the cations 113, for example, to reduce inter-ion repulsion within the stream of cations 113. If not neutralized, the cations 113 will eject from the outlet 102 and then bombard on a small area of a workpiece (not shown) to be polished, which generally faces towards the outlet 102. As a result, an excess positive charge can be locally formed on/at that small area of the workpiece. The positive charge would yield an electric field around the polished area. The electric field thus formed has a disadvantageous influence on the incoming cations 133, thereby disturbing the sequential polishing process (i.e., polishing beyond the initial bombardment could tend to be impaired or at least not as controllable). With the advent of the neutralizer 18, the neutralizer 18 emits numerous electrons. The electrons emitted interact with the cations 113 before the cations 113 bombard the workpiece, thereby preventing the formation of the electric field and ensuring the continuous and effective polishing of the workpiece. Alternatively, the neutralizer 18 could be configured for emitting electrons toward the workpiece so as to neutralize the excess positive charge formed on the workpiece.

The neutralizer 18 may be a hot filament neutralizer or a plasma bridge neutralizer. The hot filament neutralizer includes a filament, for example, a tungsten filament or a tantalum filament. The filament is configured for emitting electrons upon being heated.

Figure 2:
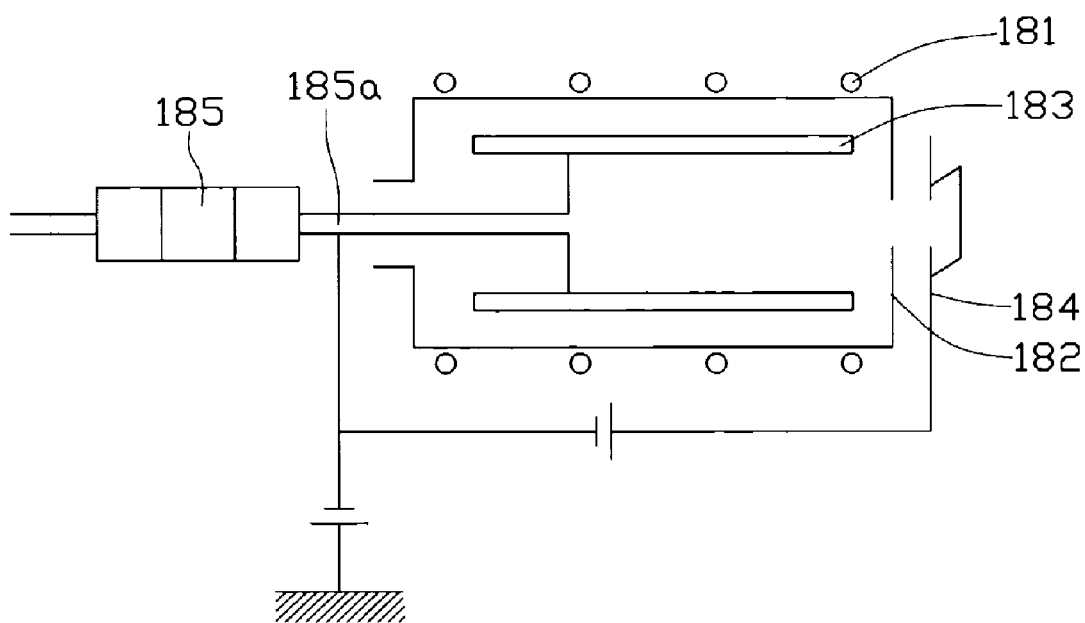
FIG. 2 is schematic view of a plasma bridge neutralizer, applied in the ion source of FIG. 1.

FIG. 2 illustrates a plasma bridge neutralizer (PBN). The plasma bridge neutralizer includes an RF (radio frequency) coil 181, a discharge house 182, a cup-shaped collector 183, an electron extraction electrode 184, and a barrier 185. The RF coil 181 is coiled (i.e., wound) on the discharge house 182. The discharge house 182 may be made of a ceramic material. The collector 183 is accommodated in the discharge house 182 and is spaced therefrom. The barrier 185 has a passage 185a communicating with the collector 183. The passage 185a is configured for supplying a discharge gas to the collector 183. The brarrer 185 is configured for preventing leakage of electrical power. The collector 183 has a negative bias voltage to attract the cations 113. The extraction electrode 184 has a positive bias voltage to extract the electrons.

During neutralizing, an RF energy is applied to the RF coil 181, and synchronously an electromagnetic wave is coupled to the discharge house 182 to form a plasma plume. This plasma plume acts as a conductive path or plasma bridge between the extraction electrode 184 and the cations 113. The cations 113 are neutralized at the conductive path or plasma bridge with the electrons extracted from the extraction electrode 184.

Figure 3:
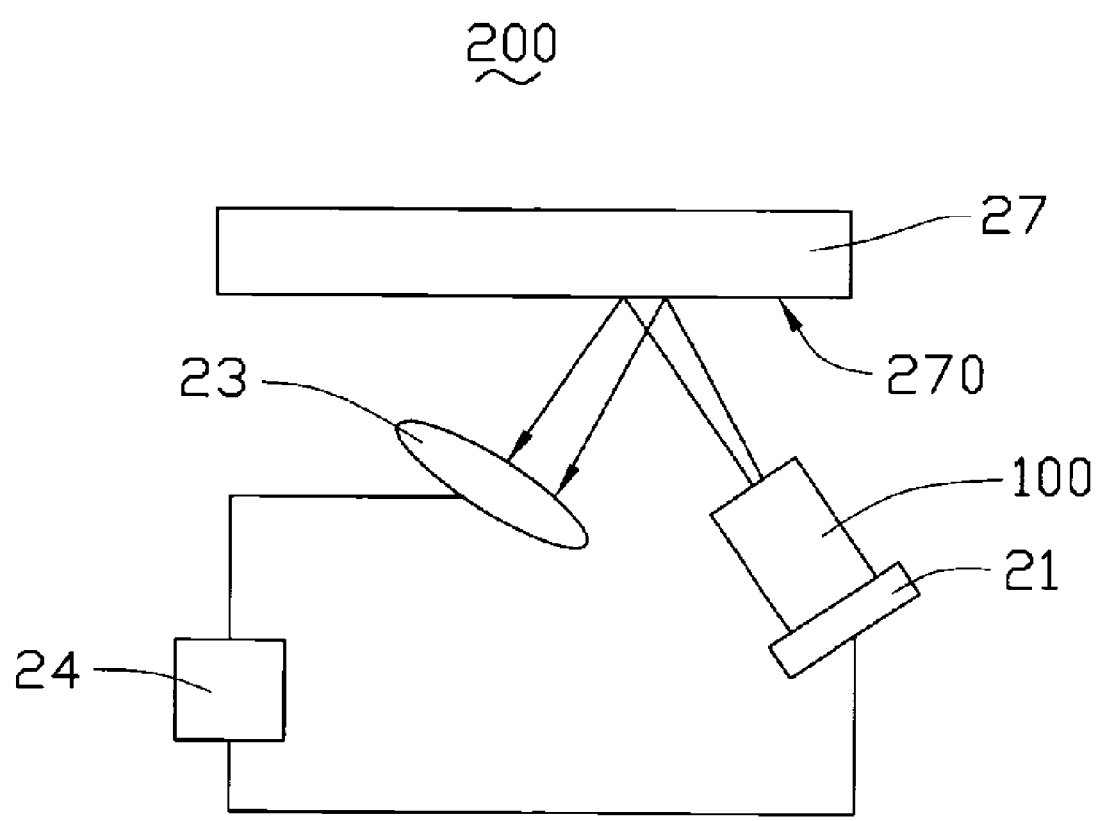
FIG. 3 is a schematic view of a polishing system, using the ion source of FIG. 1.

FIG. 3 illustrates a polishing system 200, using the ion source 100 above described, for polishing a workpiece 27 having a surface 270 to be polished. In addition to the ion source 100, the polishing system 200 includes a platform 21, a monitor device 23, and a control device 24. The ion source 100 is mounted on the platform 21. The platform 21 can be a X-Y-Z three-dimensional stage and cause the ion source 100 move to any direction and rotate or tilt to reach any difficult area to be polished. The monitor device 23 is electrically connected with the control device 24. The control device 24, in turn, is electrically connected with the platform 21 and, further advantageously, with the ion source 100.

The monitor device 23 is configured for monitoring surface characteristics (e.g., roughness, contour) of the surface 270 in real time during a polishing process and then transmitting the surface characteristic information to the control device 24. The monitor device 23 may, beneficially, employ a Fizeau interferometer (precision about micrometer scale), a Nomarshi microscope (precision about 1.22 times wavelength of light wave), and/or fringes of equal chromatic order (precision below 1 nanometer).

The control device 24 receives the information about the surface characteristics from the monitor device 23 and then adjusts and controls the ion source 100 to polish the workpiece 27 according to the information. The information indicates whether area of the surface 270 being currently polished needs to be further polished and/or whether other adjustments (e.g., ion beam power or position) need to be made. The control device 24 drives the platform 21 to move/rotate so as to adjust and direct the ion source 100 towards the area of the surface 270 being currently polished.

Figure 4:
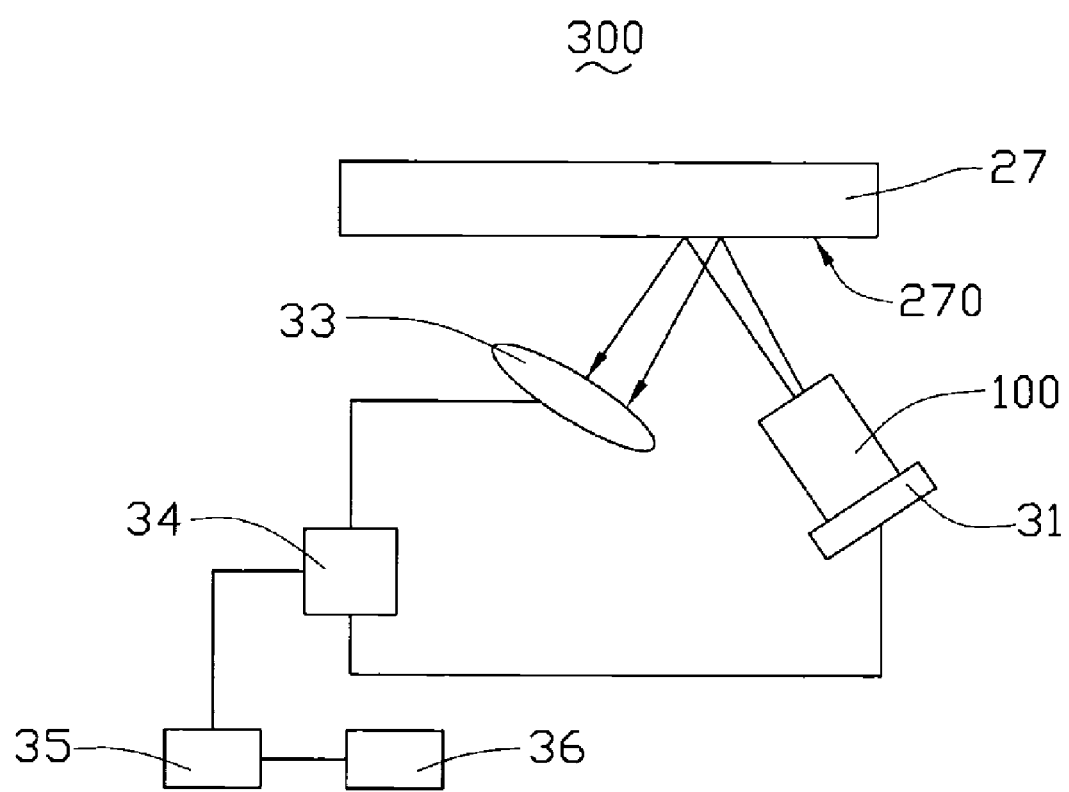
FIG. 4 is a schematic view of an alternative polishing system, using the ion source of FIG. 1.

FIG. 4 illustrates an alternative polishing system 300, using the ion source 100 above described. In addition to the ion source 100, the polishing system 300 includes a platform 31, a monitor device 33, a control device 34, a memory component 35, and an input device 36. The platform 31, the monitor device 33, and the control device 34 are essentially similar to the platform 21, the monitor device 23, and the control device 24 of the polishing system 200, respectively.

The input device 36 electrically connects with the memory component 35 and is configured for inputting initial information/data regarding the surface characteristics of the workpiece 27 into the memory component 35. The initial surface characteristic data is original information about the surface 270 before polishing, for example, length, width, geometry, microstructure, contour, hardness, etc. The memory component 35 is electrically connected with the control device 34 and is configured for storing the original surface characteristic information and then transmitting this original information to the control device 34. The control device 34 controls the ion source 100 to perform the primary polishing process according to, at least in part, to the original information transmitted thereto. Upon beginning the polishing process, the monitor device 33 is then able act in a manner similar to the monitor device 23 to facilitate adjustments to the operation of the control device 34 during processing.

Figure 5:
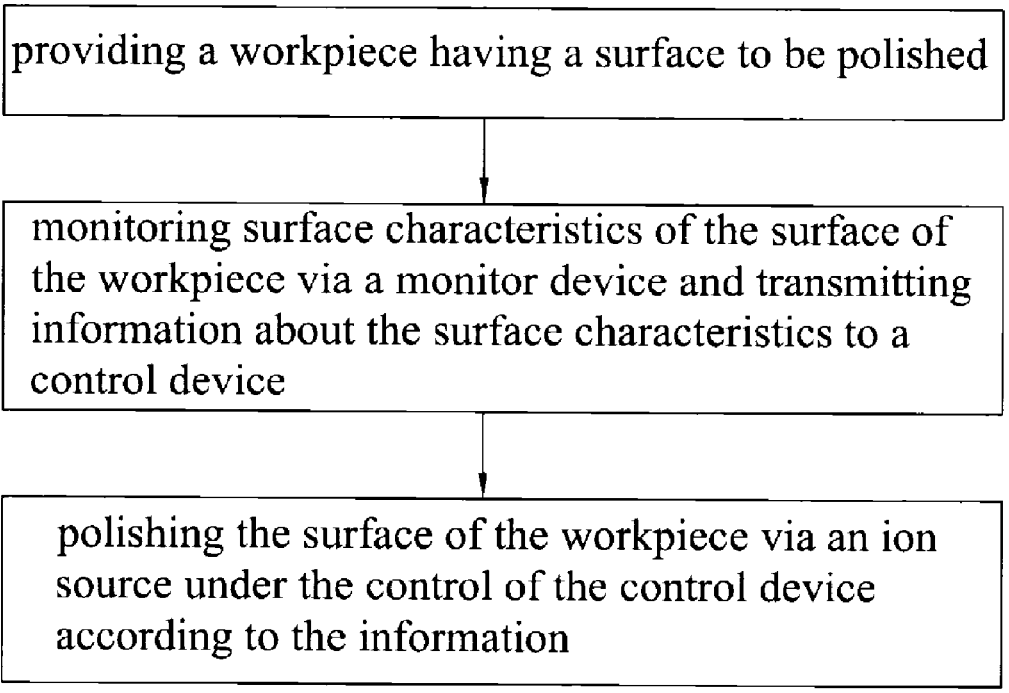
FIG. 5 is a flow chart of a method for polishing a workpiece by using the polishing system of FIG. 3 or 4.

Referring to FIGS. 4 and 5, a method for polishing a workpiece using the polishing system 300 includes the steps of: providing a workpiece having a surface to be polished; monitoring at least one surface characteristic of the surface of the workpiece via a monitor device and then transmitting information about the at least one surface characteristic to a control device; and polishing the surface via an ion source under the control of the control device according to the information.

The workpiece to be polished may be, e.g., a mold. The mold can be made, for example, of a material selected from the group consisting of: stainless steel, stainless steel with a nickel phosphide (NiP) coating, metal alloys, ceramic (such as tungsten carbide (WC) or silicon carbide (SiC)), glass, glass-ceramics, and combinations thereof. The mold typically has a surface to be polished, for example, a mold surface.

Preferably, the original information about surface characteristics of the surface 270 of the workpiece is obtained via the monitor device 33 or, alternatively, via a peripheral surface profilmeter. Additionally, certain information (e.g., dimensions, shape, hardness, etc.) may potentially be input by the user or via a data bank. The original information, however obtained, is inputted into the memory component 35 via the input device 36. The memory component 35 then supplies the original information to the control device 34 so that the control device 34 can control the ion source 100 to perform a primary polishing process according to the original information.

During the polishing process, the surface characteristics of any area of the surface 270 is monitored in real time via the monitor device 33 and a corresponding resultant information about surface characteristics of the surface 270 is then transmitted to the control device 34. According to this information, the control device 34 timely controls the positioning of the platform 31 and/or adjusts the ion source 100 to perform both precise and accurate polishing. At the same time, the two lids 172a and 172b can slide on the screen electrode 17 so as to adjust the ejecting area/shape available for the cations 113 (See FIG. 1) to satisfy different requirements of polishing properties on different areas. For example, in polishing some difficult and/or small areas, the two lids 172a and 172b can slide closely to minimize the ejecting area of the cations 113 (See FIG. 1) thereby facilitating the fine and accurate polishing of these areas. Thus, even if the mold surface, i.e., surface 270, has difficult surface geometries to be polished, such as for example, a narrow area, slot, slope surface, sharp angle surface, concave portion, or convex portion, the polishing system 300 can accurately polish the surface 270. The surface roughness Ra can be controlled in the nanometer or subnanometer range, for example, from about 0.2 nanometers to about 1.0 nanometer.

Furthermore, the ion source 100 may employ other alternative structures and configurations in other embodiments. For example, the adjusting member 172 can include four or more lids symmetrically surrounding the orifice 171. The lids can be made of a transformable material that can elongate while heated. Moreover, the screen electrode 17 can be a retractable electrode along a radial direction of the discharge chamber 10, thereby being able to self-adjust the space size and shape of the orifice 171. The electron emitter 111 can be, e.g., a hot filament. In addition to use in a polishing process, the ion source 100 can be applied in other technical and technological purposes, such as cleaning, activation, thin-film coating, aligning, and/or etching.

It will be understood that the above particular embodiments and methods are shown and described by way of illustration only. The principles and features of the present inven-

What is claimed is:

1. An ion source configured for ejecting ion beams, the ion source comprising:
   a discharge chamber configured for accommodating a discharge gas;
   an electron emitter disposed in the discharge chamber;
   a cathode having a lower voltage than the emitter;
   a screen grid having a lower voltage than the cathode;
   an accelerator grid having a lower voltage than the screen grid; and
   a screen electrode defining an adjustable orifice, the adjustable orifice being configured for facilitating adjustment of an ejecting area through which the ion beams are capable of being ejected;
   wherein the cathode, the screen grid, the accelerator grid, and the accelerator grid are separately aligned in the discharge chamber in an ascending order with respect to a respective distance thereof from the electron emitter.

2. The ion source as claimed in claim 1, wherein the screen electrode comprises an adjusting member configured for adjusting a space size and shape of the orifice.

3. The ion source as claimed in claim 2, wherein the adjusting member comprises a plurality of lids slideably mounted on the screen electrode, the lids cooperatively and selectably covering part or all area of the orifice, the lids therefore being configured for adjusting the space size and shape of the orifice by sliding the lids on the screen electrode.

4. The ion source as claimed in claim 1, wherein the screen electrode is retractable along a radial direction of the discharge chamber and thereby is configured for self-adjusting the space size and shape of the orifice.

5. The ion source as claimed in claim 1, further comprising a magnetic coil separately wound around the electron emitter, the magnetic coil being coaxial with the electron emitter and the cathode.

6. The ion source as claimed in claim 1, wherein the cathode is a conic dome having a top portion at a distance from the electron emitter, the top portion defining an opening.

7. The ion source as claimed in claim 6, wherein the orifice of the screen electrode is coaxial with the electron emitter and the opening of the cathode.

8. The ion source as claimed in claim 1, wherein the cathode is covered with a shield layer.

9. The ion source as claimed in claim 1, further comprising an ion neutralizer positioned in the vicinity of the orifice of the screen electrode.

10. The ion source as claimed in claim 9, wherein the ion neutralizer is one of a hot filament neutralizer and a plasma bridge neutralizer.

11. A polishing system comprising:
    a platform configured for being selectably moved at least one of linearly and rotationally;
    a control device connected with the platform, the control device being configured for controlling movement of the platform;
    a monitor device connected with the control device, the monitor device being configured for at least one of measuring and monitoring surface characteristics of a workpiece to be polished and for transmitting information about the surface characteristics to the control device, the control device controlling the movement of the platform according to the information supplied thereto; and
    an ion source mounted on the platform, the ion source being configured for ejecting ion beams and comprising:
    a discharge chamber configured for accommodating discharge gas;
    an electron emitter disposed in the discharge chamber;
    a cathode having a lower voltage than the emitter;
    a screen grid having a lower voltage than the cathode;
    an accelerator grid having a lower voltage than the screen grid; and
    a screen electrode having a lower voltage than the accelerator grid, the screen electrode defining an adjustable orifice, the adjustable orifice being configured for facilitating adjustment of an ejecting area through which the ion beams are capable of being ejected;
    wherein the cathode, the screen grid, the accelerator grid, and the accelerator grid are separately aligned in the discharge chamber in an ascending order with respect to a respective distance thereof from the electron emitter.

12. The polishing system as claimed in claim 11, further comprising a memory component electrically connected with the control device, the memory component being configured for storing original information regarding the surface characteristics of the workpiece and for transmitting the original information to the control device, the control device further being configured for controlling the ion source to perform a primary polishing process according to the original information.

13. The polishing system as claimed in claim 12, further comprising an input device electrically connected with the memory component, the input device being configured for inputting the original information of the surface characteristics into the memory component.

14. The polishing system as claimed in claim 11, wherein the platform is a X-Y-Z three-dimensional stage.

15. The polishing system as claimed in claim 11, wherein the monitor device is comprised of at least one of a Fizeau interferometer, a Nomarshi microscope, and a plurality of fringes of equal chromatic order.

16. A method for polishing a workpiece, the method comprising the steps of:
    providing a workpiece having a surface to be polished;
    monitoring surface characteristics of the surface of the workpiece via a monitor device and transmitting information about the surface characteristics to a control device;
    polishing the surface of the workpiece via an ion source, the ion source being under the control of the control device, the control device operating according to the information received thereby from the monitor device.

17. The method as claimed in claim 16, further comprising steps of: obtaining an amount of original information about surface characteristics of the surface of the workpiece; transmitting the original information to the control device; performing a primary polishing on the surface of the workpiece via an ion source, the ion source being under the control of the control device, an operation of the control device being based, at least in part, upon the original information transmitted thereto.

18. The method as claimed in claim 16, wherein the workpiece is one of a mold, a semiconductor element, and an optical element.

* * * * *